United States Patent
Wang et al.

(10) Patent No.: US 8,420,941 B2
(45) Date of Patent: Apr. 16, 2013

(54) CONDUCTIVE CHANNEL OF PHOTOVOLTAIC PANEL AND METHOD FOR MANUFACTURING THE SAME

(75) Inventors: Chen-Chan Wang, Jhunan Township, Miaoli County (TW); Kuei-Wu Huang, Jhunan Township, Miaoli County (TW); Nai-Tien O, Jhunan Township, Miaoli County (TW); Tien-Szu Chen, Jhunan Township, Miaoli County (TW); Ching-Tang Tsai, Jhunan Township, Miaoli County (TW); Kai-Sheng Chang, Jhunan Township, Miaoli County (TW); Hua-Hsuan Kuo, Jhunan Township, Miaoli County (TW); Chi-Cheng Lee, Jhunan Township, Miaoli County (TW); Yu-Chih Chan, Jhunan Township, Miaoli County (TW)

(73) Assignee: Gintech Energy Corporation, Jhunan Township, Miaoli County (TW)

( * ) Notice: Subject to any disclaimer, the term of this patent is extended or adjusted under 35 U.S.C. 154(b) by 368 days.

(21) Appl. No.: 12/783,032

(22) Filed: May 19, 2010

(65) Prior Publication Data

US 2011/0240339 A1    Oct. 6, 2011

(30) Foreign Application Priority Data

Apr. 2, 2010   (TW) ................................ 99110417 A

(51) Int. Cl.
*H01B 5/00*        (2006.01)
*H05K 1/03*        (2006.01)
*H05K 1/16*        (2006.01)
*H05K 1/11*        (2006.01)
*H01L 31/042*      (2006.01)
*H01L 31/00*       (2006.01)

(52) U.S. Cl.
USPC ........ 174/126.2; 174/255; 174/260; 174/263; 136/244; 136/252; 136/256

(58) Field of Classification Search .......... 136/243–265; 174/260–266, 126.2, 255; 361/767, 773–774
See application file for complete search history.

(56) References Cited

U.S. PATENT DOCUMENTS

| | | | |
|---|---|---|---|
| 2003/0024733 A1* | 2/2003 | Aoyama et al. | 174/260 |
| 2005/0211461 A1* | 9/2005 | Horikoshi et al. | 174/117 FF |
| 2006/0162770 A1* | 7/2006 | Matsui et al. | 136/263 |
| 2007/0017570 A1* | 1/2007 | Endo et al. | 136/256 |
| 2008/0076307 A1* | 3/2008 | Nishi et al. | 439/886 |
| 2008/0169020 A1* | 7/2008 | Shiomi et al. | 136/252 |
| 2009/0260689 A1* | 10/2009 | Nishi et al. | 136/261 |
| 2010/0071949 A1* | 3/2010 | Murakami et al. | 174/261 |

* cited by examiner

*Primary Examiner* — Timothy Thompson
*Assistant Examiner* — Sherman Ng
(74) *Attorney, Agent, or Firm* — Muncy, Geissler, Olds & Lowe, PLLC

(57) ABSTRACT

An electrically conductive ribbon, which is soldered on an electrically conductive busbar of a photovoltaic panel, includes a cooper core and a tin based solder. The tin based solder fully wraps an outer surface of the cooper core, and has a convex solder surface, which has a first curvature to be fitted with a second curvature of a concave solder surface of the electrically conductive busbar.

4 Claims, 3 Drawing Sheets

CONDUCTIVE CHANNEL OF PHOTOVOLTAIC PANEL AND METHOD FOR MANUFACTURING THE SAME

RELATED APPLICATIONS

This application claims priority to Taiwan Application Serial Number 99110417, filed Apr. 2, 2010, which is herein incorporated by reference.

BACKGROUND

1. Field of Invention

The present invention relates to a photovoltaic panel. More particularly, the present invention relates to an electrically conductive channel of a photovoltaic panel.

2. Description of Related Art

In recent years, awareness of ecological problems has been raised worldwide. Among other things, the global warming resulting from $CO_2$ emission is a serious concern, and clean energy has been increasingly desired. In such a circumstance, a solar cell shows great promise to serve as a source of clean energy in terms of its safety and operability.

The solar panel includes a photoelectric conversion layer for converting light into electricity, typical materials of which include single-crystal silicon semiconductor, polycrystalline silicon semiconductor, amorphous silicon-based semiconductor, groups III-V compound semiconductor, groups II-VI compound semiconductor and groups I-III-VI2 compound semiconductor.

In addition to the photoelectric conversion layer for converting light into electricity, the solar panel still needs a plurality of electrically conductive channels to collect electricity and output for external use or storing in a battery.

In order to reduce less energy consumption during electricity transporting, a contact resistance at a joint interface should be as low as possible, e.g. solder joint should be well soldered to enhance its bonding strength, so as to enhance a solar panel's operation efficiency and prolong its operation life.

SUMMARY

It is therefore an objective of the present invention to provide an improved electrically conductive ribbon of a photovoltaic panel, thereby enhancing solder joint between the electrically conductive ribbon and busbar of the photovoltaic panel.

In accordance with the foregoing and other objectives of the present invention, an electrically conductive ribbon, which is soldered on an electrically conductive busbar of a photovoltaic panel, includes a cooper core and a tin based solder. The tin based solder fully wraps an outer surface of the cooper core, and has a convex solder surface, which has a first curvature to be fitted with a second curvature of a concave solder surface of the electrically conductive busbar.

According to an embodiment disclosed herein, the cooper core includes an outer surface to be conformal with the convex solder surface.

According to an embodiment disclosed herein, the cooper core includes a rectangular cross-section.

According to an embodiment disclosed herein, the electrically conductive ribbon further includes a convex reflective surface, the convex solder surface and the convex reflective surface are disposed at two opposite sides of the electrically conductive ribbon.

According to an embodiment disclosed herein, the tin based solder further includes silver or lead.

In accordance with the foregoing and other objectives of the present invention, a method for manufacturing a photovoltaic electrically conductive channel includes the following steps. An electrically conductive busbar is screen printed on a photovoltaic panel. A first curvature of a concave solder surface of the electrically conductive busbar is measured. An electrically conductive ribbon is manufactured to have a convex solder surface equipped with a second curvature to be fitted with the first curvature. The convex solder surface of the electrically conductive ribbon is soldered upon the concave solder surface of the electrically conductive busbar.

According to an embodiment disclosed herein, the electrically conductive busbar is a silver based paste.

According to an embodiment disclosed herein, the electrically conductive ribbon includes a cooper core and a tin based solder, wherein the tin based solder fully wraps an outer surface of the cooper core.

According to an embodiment disclosed herein, the cooper core includes an outer surface to be conformal with the convex solder surface.

According to an embodiment disclosed herein, the electrically conductive ribbon further includes a convex reflective surface, the convex solder surface and the convex reflective surface are disposed at two opposite sides of the electrically conductive ribbon, the convex reflective surface is a silver coated surface.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
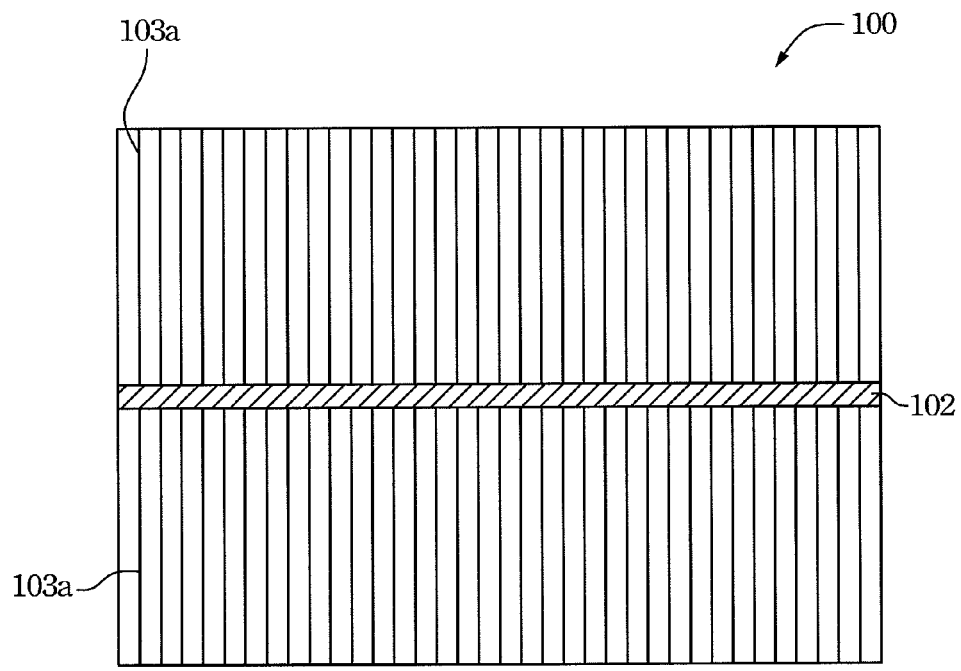
FIG. 1 illustrates a top view of a photovoltaic panel according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a top view of a photovoltaic panel according to one preferred embodiment of this invention. Multiple electrically conductive channels are formed on the photovoltaic 100 by screen printing, so as to collect electric energy, generated by the photovoltaic array, by electrically conductive channels 103a with a relatively small cross-section and to be transferred to an electrically conductive channel 102 with a relatively large cross-section, and then transferred out for external use or stored in a battery.

Figure 2:
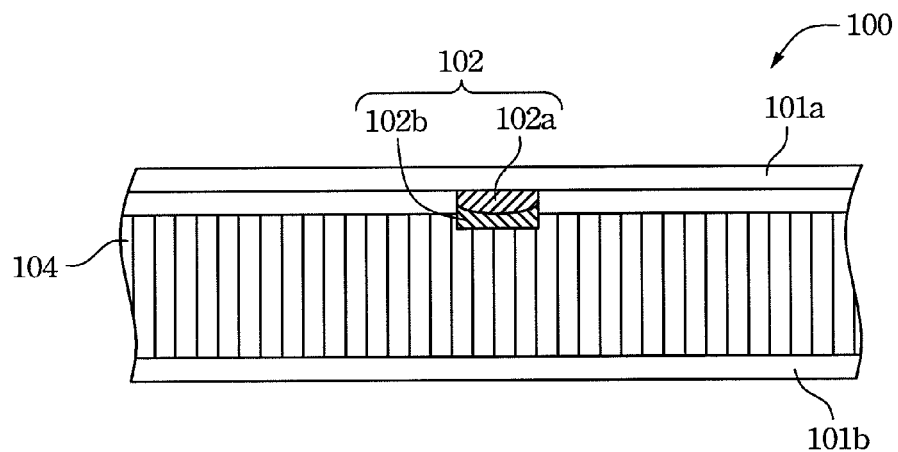
FIG. 2 illustrates a cross-sectional view of the photovoltaic panel illustrated in FIG. 1.

FIG. 2 illustrates a cross-sectional view of the photovoltaic panel illustrated in FIG. 1. The photovoltaic panel 100 includes a photovoltaic array 104, the electrically conductive channel 102, an upper substrate 101a and a lower substrate 101b. The electrically conductive channel 102 can be divided into two parts: an electrically conductive busbar 102b, which is manufactured first, and an electrically conductive ribbon 102a, which is manufactured later. The electrically conductive busbar 102b is formed first by screen printing a silver based paste on the photovoltaic array 104. The electrically conductive channels 103a (as illustrated in FIG. 1) are formed using the same way, i.e. by screen printing silver based pastes. After the electrically conductive busbar 102b, i.e. the silver based paste, is cured after heating, the electrically conductive ribbon 102a is then soldered upon the electrically conductive busbar 102b. Because the silver based paste is liquid in its initial phase and manufactured by screen-printing, its cross-sectional profile would be formed with a "M" like shape. That is, the electrically conductive busbar 102b has a top concave solder surface. When the electrically conductive ribbon 102a has a flat solder surface, a soldered interface between the electrically conductive ribbon 102a and electrically conductive busbar 102b may not be good enough, e.g. poor soldering or bonding strength is weak. Therefore, a convex solder surface of the electrically conductive ribbon 102a is formed to have a first curvature to be fitted with a second curvature of a concave solder surface of the electrically conductive busbar 102b.

Figure 3:
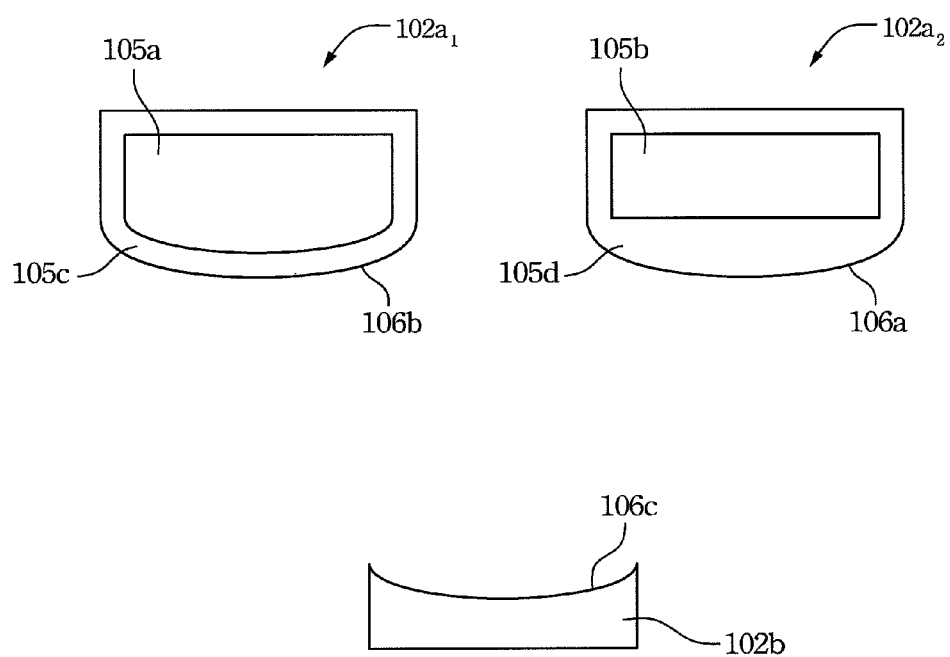
FIG. 3 illustrates cross-sectional views of an electrically-conductive busbar and two electrically-conductive ribbons according to one preferred embodiment of this invention.

FIG. 3 illustrates cross-sectional views of an electrically conductive busbar and two electrically-conductive ribbons according to one preferred embodiment of this invention. In order to well solder the electrically conductive busbar and electrically conductive ribbon, a first curvature of the concave solder surface 106c of the electrically conductive busbar 102b can be measured first, and convex solder surfaces (106a-106b) of the electrically conductive ribbons ($102a_1$-$102a_2$) are accordingly manufactured to have a convex solder surface with a second curvature to be fitted with the first curvature of the concave solder surface 106c of the electrically conductive busbar 102b. The electrically conductive ribbon includes a cooper core and a tin based solder, and the tin based solder fully wraps an outer surface of the cooper core. The electrically conductive ribbon can be manufactured by several different ways. Take the electrically conductive ribbon $102a_1$ for example, the cooper core 105a is accordingly manufactured to have a convex surface with a second curvature to be fitted with the first curvature of the concave solder surface 106c of the electrically conductive busbar 102b, and the tin based solder 105c then fully and uniformly wraps an outer surface of the cooper core 105a. Therefore, the cooper core 105a and tin based solder 105c share a conformal profile, namely, the convex solder surface 106b of the tin based solder 105c is also fitted with the concave solder surface 106c. Take an electrically conductive ribbon $102a_2$ for another example, a cooper core 105b is first formed with a rectangular cross-section, a tin based solder 105d is then formed to fully wrap the cooper core 105b and to form a convex solder surface 106a with a second curvature to be fitted with the first curvature of the concave solder surface 106c. The above-mentioned two ways are for manufacturing a convex solder surface of the electrically conductive ribbon to have a fitted curvature. In this embodiment, the tin based solder may be made by adding extra silver or lead, e.g. silver is added to enhance electrical conductivity and lead is added to lower a melting point of the composite solder.

Figure 4:
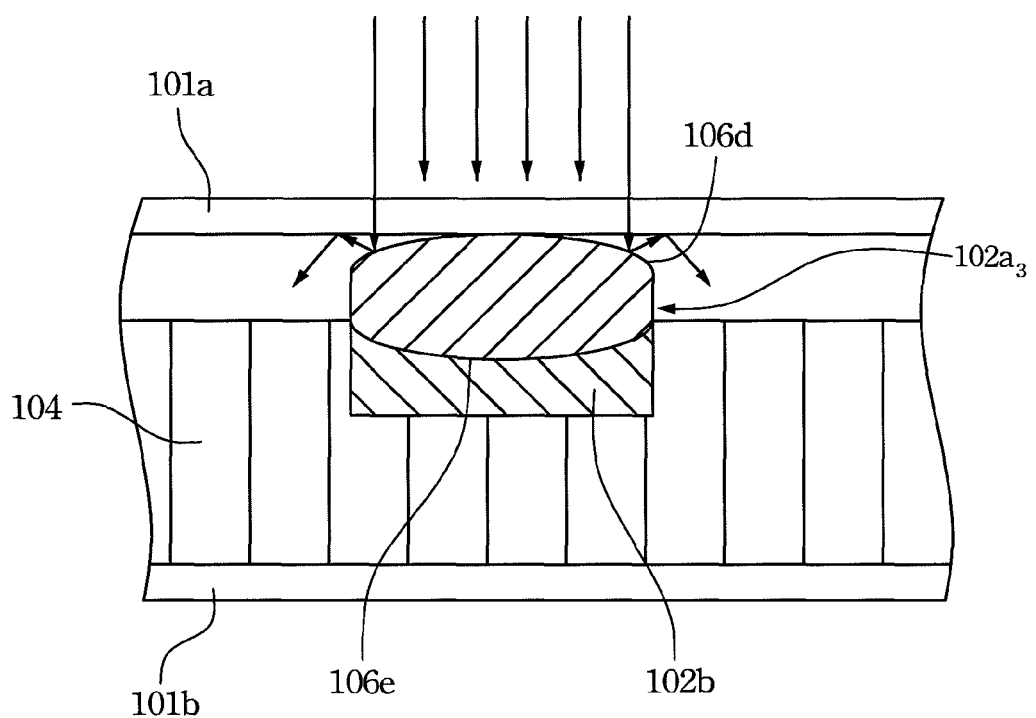
FIG. 4 illustrates a cross-sectional view of a photovoltaic panel according to another preferred embodiment of this invention.

FIG. 4 illustrates a cross-sectional view of a photovoltaic panel according to another preferred embodiment of this invention. Although the electrically conductive only shield or reflect partial light, which penetrates through the substrate 101a, the electrically conductive ribbon $102a_3$ is formed to have a convex reflective surface 106d, e.g. a silver coated surface or a high reflective surface, rather than a flat reflective surface. The convex reflective surface 106d reflect most incident light into the photovoltaic array 104 (by two times reflecting as indicated by arrows) such that the photovoltaic array 104 can convert more light into electric energy. In this embodiment, the convex reflective surface 106d and convex solder surface 106e are located at two opposite sides of the electrically conductive ribbon $102a_3$.

According to the above-discussed embodiment, the design and manufacturing method of the electrically conductive ribbon would enhance a soldered interface between the electrically conductive ribbon and electrically conductive busbar, thereby avoiding poor soldering or weak bonding strength. Besides, the convex reflective surface is designed to direct more incident light into the photovoltaic array such that the photovoltaic array can convert more light into electric energy.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrically conductive ribbon, which is soldered on an electrically conductive busbar of a photovoltaic panel, the electrically conductive ribbon comprising:
   a cooper core; and
   a tin based solder fully wrapping an outer surface of the cooper core, and having a convex solder surface, which has a first curvature to be fitted with a second curvature of a concave solder surface of the electrically conductive busbar, wherein the cooper core comprises an outer surface to be conformal with the convex solder surface.

2. The electrically conductive ribbon of claim 1, wherein the cooper core comprises a rectangular cross-section.

3. The electrically conductive ribbon of claim 1, further comprising a convex reflective surface, the convex solder surface and the convex reflective surface are disposed at two opposite sides of the electrically conductive ribbon.

4. The electrically conductive ribbon of claim 1, wherein the tin based solder further comprises silver or lead.

* * * * *